(12) United States Patent
Freund et al.

(10) Patent No.: US 10,747,258 B1
(45) Date of Patent: Aug. 18, 2020

(54) DISTRIBUTED DIGITAL RING OSCILLATORS IN A DIGITAL SYSTEM

(71) Applicant: Amazon Technologies, Inc., Seattle, WA (US)

(72) Inventors: Eyal Freund, Austin, TX (US); Yaniv Shapira, Bet Itzhak (IL)

(73) Assignee: Amazon Technologies, Inc., Seattle, WA (US)

( * ) Notice: Subject to any disclaimer, the term of this patent is extended or adjusted under 35 U.S.C. 154(b) by 274 days.

(21) Appl. No.: 15/445,747

(22) Filed: Feb. 28, 2017

(51) Int. Cl.
*G06F 1/12* (2006.01)
*H03K 3/03* (2006.01)

(52) U.S. Cl.
CPC ............. *G06F 1/12* (2013.01); *H03K 3/0315* (2013.01)

(58) Field of Classification Search
None
See application file for complete search history.

(56) References Cited

U.S. PATENT DOCUMENTS

| | | | | |
|---|---|---|---|---|
| 6,657,504 B1* | 12/2003 | Deal | ................... | G01R 31/2824 324/762.02 |
| 6,933,739 B1* | 8/2005 | Rosen | ................ | G01R 31/2884 324/762.03 |
| 7,746,183 B2* | 6/2010 | Kim | ......................... | H03K 3/03 324/73.1 |
| 2008/0270049 A1* | 10/2008 | Kim | ................. | G01R 31/31725 702/58 |
| 2013/0336080 A1* | 12/2013 | Frans | ..................... | G11C 7/222 365/226 |
| 2016/0265982 A1* | 9/2016 | Bachand | .................. | G01K 3/00 |

* cited by examiner

*Primary Examiner* — Fahmida Rahman
(74) *Attorney, Agent, or Firm* — Kilpatrick Townsend & Stockton LLP

(57) ABSTRACT

A semiconductor device includes a system clock signal having a system clock period and a digital ring oscillator (DRO) cluster having DRO cells. Each of the DRO cells is disposed at a different location in the semiconductor device for producing a local ring oscillator clock signal. The local ring oscillator clock signal has a ring oscillator clock period that is shorter than the system clock period. The DRO cluster is configured to measure respective ring oscillator clock count in each of the DRO cells during a time window synchronized to the system clock.

19 Claims, 13 Drawing Sheets

US 10,747,258 B1

DISTRIBUTED DIGITAL RING OSCILLATORS IN A DIGITAL SYSTEM

BACKGROUND

The performance of a digital system, such as a central processing unit (CPU), is often measured by its clock rate, which is the frequency at which the system is running and is used as an indicator of the processor's speed. It is measured in clock cycles per second or its equivalent, the hertz (Hz). With the advancement of technology, the speeds of digital systems continue to increase. CPUs designed for high-performance markets might require custom designs for each of these items to achieve frequency, power-dissipation, and chip-area goals. Control logic implementation techniques (logic synthesis using CAD tools) can be used to implement data paths, register files, and clocks. However, as the speed of modern digital systems further progresses well above gigahertz (GHz), it is becoming increasingly difficult to design and debug these high speed digital systems. It is also more difficult to understand the characteristics of the CPU that are limiting the circuit speed. For example, in certain implementations, as the system clock is increased, system speed degradation may be observed. In such instances, it is difficult to determine the portion of the circuit and program operation state responsible for the speed degradation.

It is therefore desirable to provide a system and method for determining events that limit system performance at high speed.

BRIEF DESCRIPTION OF THE DRAWINGS

Various embodiments in accordance with the present disclosure will be described with reference to the drawings, in which.

DETAILED DESCRIPTION

Figure 1:
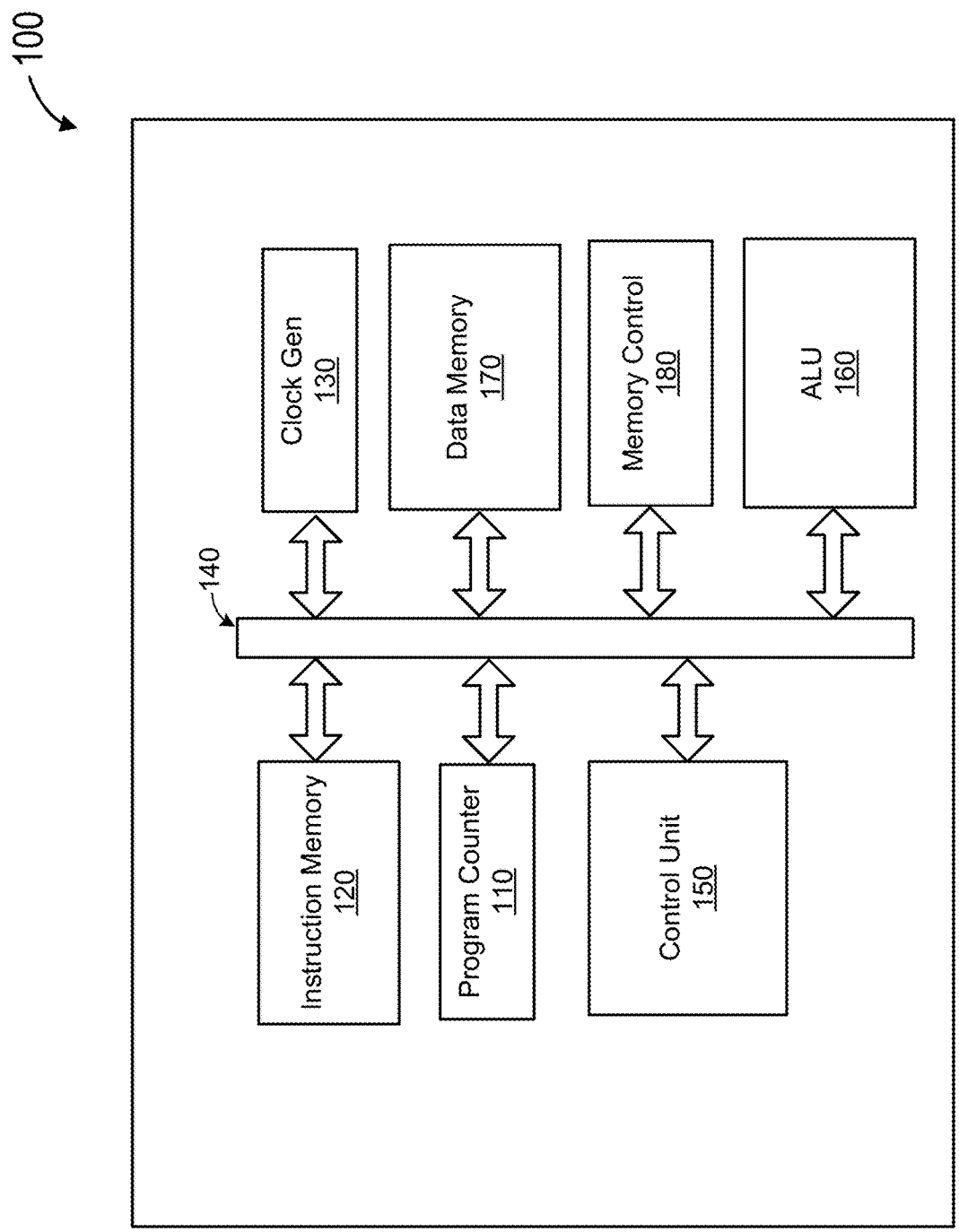
FIG. 1 is a simplified block diagram illustrating a digital system.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described herein include systems and methods for detecting local speed drop in a high speed digital system. As speed of modern digital systems further progresses well above gigahertz (GHz), it is becoming increasingly difficult to design and debug these high speed digital systems. It is also more difficult to understand characteristics of the CPU that limit the circuit speed. For example, in certain implementations, as the system clock is increased, system speed degradation may be observed. Such degradation may be a result of unexpected voltage drops across different portions of the digital system, such as the CPU, that may result from increased speeds and high toggling rate of the surrounding logic. In such instances, it is difficult to determine the portion of the circuit and program operation responsible for the speed degradation.

In some embodiments, fast digital ring-oscillator (DRO) cells are disposed at various locations in a digital system, which may be implemented in a semiconductor device, and the speed of the DRO cell at a specific location can be used as an indication of the local voltage. In some embodiments, the DRO cells' frequency can be 10 GHz or higher to provide adequate resolution to detect changes in the circuit speeds due to small voltage drops. The DRO cell includes a detection logic to determine if the speed of a ring oscillator in the DRO cell is below a pre-set threshold value. As used herein, a "freeze" event from a DRO cell is generated when the ring oscillator count readout for a DRO cell falls below a programmable threshold for the respective DRO cell. As described in more detail later, an aggregation of the "freeze" events from several DRO cells disposed across the digital system enables simultaneous monitoring of the different local speeds and voltage-drops (also referred to as IR drop, i.e. current-resistance drop) across the digital system.

In some embodiments, a semiconductor device includes several DRO cells. Each DRO cell is disposed at a different location in the semiconductor device and includes a ring oscillator for determining a DRO clock count during a time window. Each DRO cell is configured to provide a trigger signal (referred to as a "freeze" event above) based on the ring oscillator count being below a minimum threshold value. The semiconductor device also includes a control circuit coupled to each of the DRO cells for providing an enable signal to turn on each of the DRO cells and for synchronizing DRO clock counting in each of the DRO cells to a system clock of the semiconductor device. The control circuit is further configured for receiving the trigger signal from each of the DRO cells. The DRO cells are coupled in series for receiving control parameters to the DRO cells and outputting DRO clock count results from the DRO cells. The DRO cells are coupled together using signals, traces or wires in series in a chain like fashion, wherein the Data Out for one DRO cell is the Data In for another DRO cell.

In some embodiments, a semiconductor device includes a system clock signal having a system clock period and a digital ring oscillator (DRO) cluster having several DRO cells. Each of the DRO cells is disposed at a different location in the semiconductor device and produces a local ring oscillator clock signal. The local ring oscillator clock signal has a ring oscillator clock period that is shorter than the system clock period. In other words, the local ring oscillator clock for the DRO cells is faster than the system clock. The DRO cluster is configured to measure respective ring oscillator clock count in each of the DRO cells during a time window synchronized to the system clock.

In some embodiments, a method for identifying voltage variations in a semiconductor device includes simultaneously determining a ring oscillator speed for each of a plurality of digital ring oscillator (DRO) cells disposed at different locations in the semiconductor device. The method also includes producing a trigger signal if the count in any of the DRO cells falls below a reference value.

FIG. 1 is a simplified block diagram illustrating a digital system according to an example embodiment. Embodiments of the disclosed technology can be applied to a digital system, which can be, for example, a CPU (central processing unit), a processor, or a system-on-chip (SoC), etc. In some embodiments, the digital system can be implemented as a semiconductor device. Merely as an example, the embodiments are described in connection with a CPU 100 in FIG. 1.

CPU 100 is configured to execute a sequence of stored instructions that is called a program. CPU 100 uses a program counter 110 to access the instructions stored in an instruction memory 120. An instruction execution cycle can include fetch, decode, and execute steps. CPU 100 also has a clock generation circuit 130 for controlling the operation of various functional blocks, which communicate through a bus 140. A control unit 150 contains circuitry that uses electrical signals to direct the entire computer system to carry out stored program instructions. CPU 100 also includes an arithmetic logic unit (ALU) 160 that is a digital circuit that performs arithmetic and logic operations. The result of the ALU operations may be stored in a data memory 170. A memory control unit 180 provides memory access functions. CPU 100 can include other blocks and functions, which are omitted to simplify the description.

As speed of modern digital systems further progresses well above a gigahertz (GHz), such as CPU 100 described above, it is becoming increasingly difficult to design and debug these high speed digital systems. It is also more difficult to understand characteristics of the CPU that are limiting the circuit speed. For example, in certain implementations, as the system clock is increased, system speed degradation may be observed. In such instances, it is difficult to determine the portion of the circuit and program operation responsible for the speed degradation.

Techniques described herein include systems and methods for detecting local speed drop in a high speed digital system. The local speed drop off is often caused by local IR drop. As used herein, "IR" drop refers to voltage drop as a current (I) flows through a signal path which has electrical resistance (R). In certain circuits, the IR drop can be made worse by high activity rate of other transistors in the interconnect. This IR drop is also referred to as dynamic IR drop. Therefore, it is desirable to be able to determine variations in local supply voltage caused by IR drop in a digital system. As described below, in embodiments of the disclosed technologies, the count of the oscillations by the ring oscillators are used to deduce variations in local supply voltages caused by IR drop.

In some embodiments, a digital ring oscillator (DRO) can be implemented using an odd number of inverters connected in a ring. The inverters are connected in a chain and the output of the last inverter is fed back into the first. The ring oscillator output oscillates between two voltage levels, representing a logic high level and a logic low level. Each inverter contributes to the delay of the signal around the ring of inverters. Increasing the number of inverters to the ring increases the total delay and thereby decreases the oscillator frequency. Changing the supply voltage also changes the delay through each inverter, because lower voltages typically can increase the delay and reduce the oscillator frequency.

Figure 2:
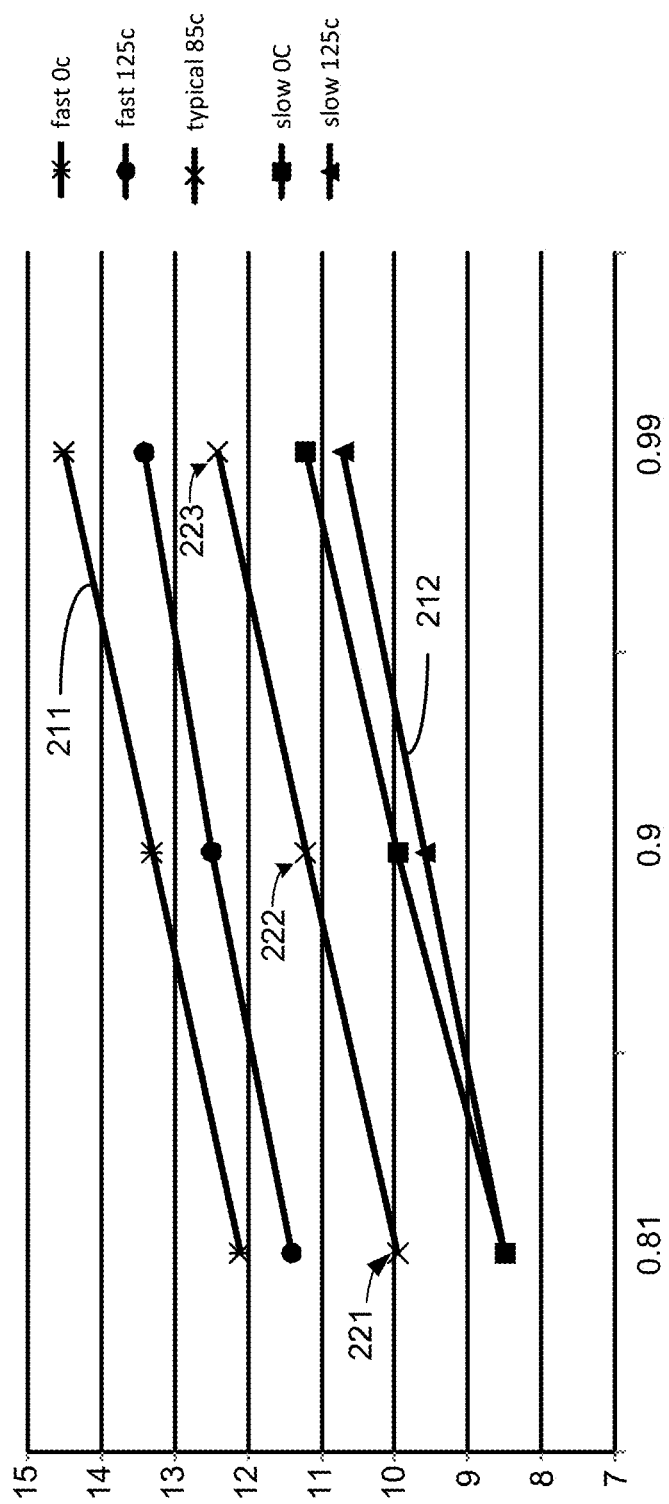
FIG. 2 is a plot illustrating ring oscillator speed versus voltage variations and process conditions according to an example embodiment.

FIG. 2 is a diagram illustrating ring oscillator speed versus variations in supply voltage variations and process conditions according to an example embodiment. In FIG. 2, the vertical axis represents the number of ring oscillator clock counts in a pre-set time window, which is used as a measure of the ring oscillator clock speed. The horizontal axis shows the supply voltage, at 0.81, 0.9, and 0.99 V, respectively. The process conditions are marked by the slow, typical, and fast labels, which represent the process conditions that resulted in the speed of building block MOS transistors being slow, typical, or fast. Further, three operating temperatures are illustrated and marked as 0° C., 85° C., and 125° C. in FIG. 2. It can be seen that the ring oscillator speed, as represented by ring oscillator clock counts in a given time window, decreases with rising temperature, and increases with the speed of the building block transistors. For example, the highest clock count 211 is measured with ring oscillators with fast transistors at 0° C., and the lowest clock count 212 is measured with ring oscillators with slow transistors at 125° C. Further, the ring oscillator speed, as represented by clock counts, increases with the supply voltage. For example, a ring oscillator made with typical transistors has a clock count of 10 at 0.81 V as shown by data point 221, a clock count of 11.2 at 0.9 V as shown by data point 222, and a clock count of 12.4 at 0.99 V as shown be data point 223.

For a digital system implemented as a semiconductor device in an integrated circuit chip, the variation of process condition and operating temperature can be presumed to be minimal. Process variations can be measured and normalized, and temperature variations tend to have relatively small effect on the speed. As illustrated in FIG. 2, as the voltage decreases from right to left in the graph in FIG. 2, so does the ring oscillator count decrease proportionally. Therefore, the ring oscillator clock speed can be correlated to voltage drop for a known temperature. Therefore, the variation in ring oscillator speed for each of the DRO cells spread throughout the digital system can be used as a map or an indication of changes in local voltages for the respective areas that the DRO cells are located at.

Figure 3:
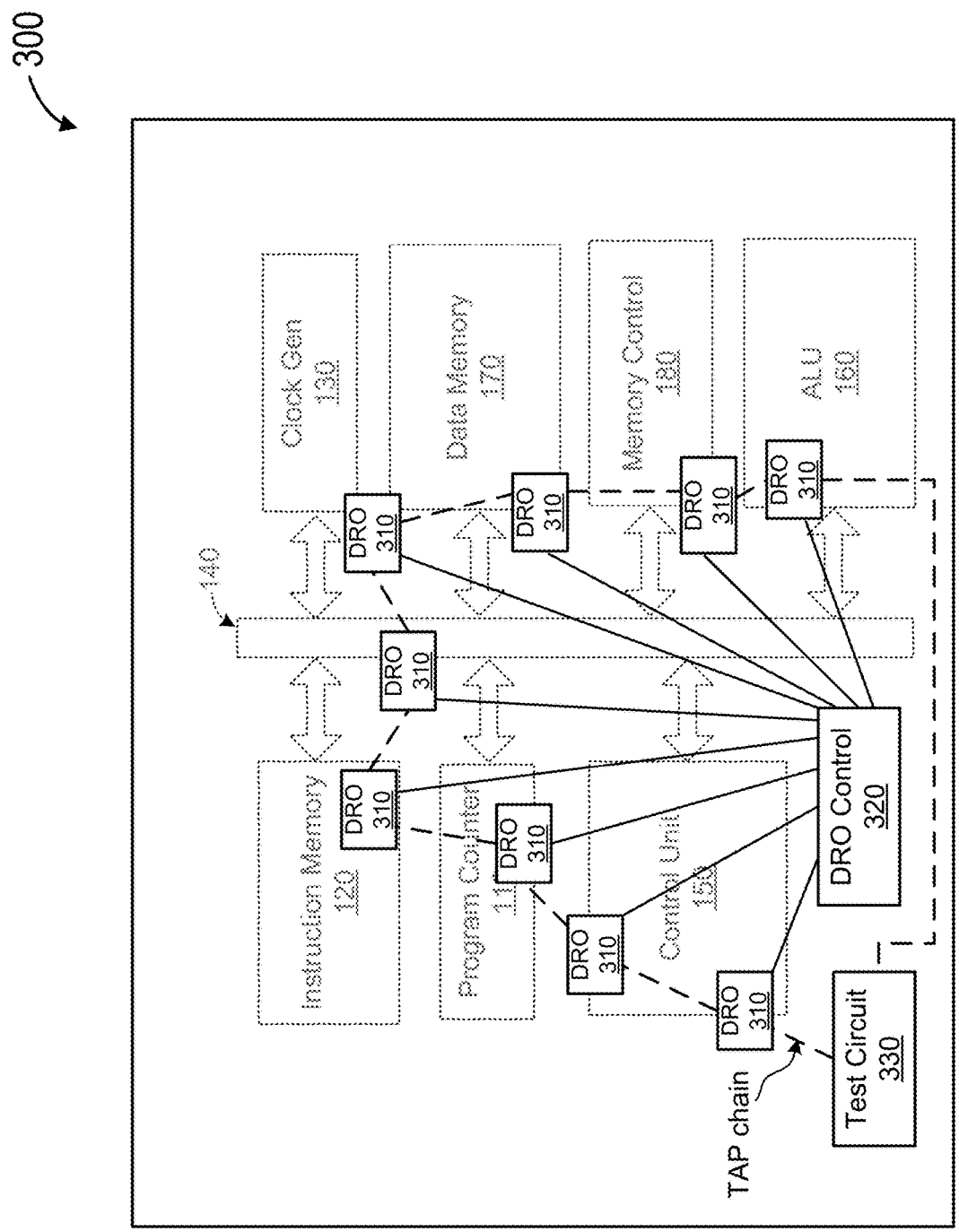
FIG. 3 is a simplified block diagram illustrating a digital system including a digital ring oscillator (DRO) cluster for determining local speed/voltage variation according to an example embodiment.

FIG. 3 is a simplified block diagram illustrating a digital system including a digital ring oscillator (DRO) cluster comprising several DRO cells for determining local voltage variation according to an example embodiment. FIG. 3 illustrates a digital system 300, which can be implemented as a semiconductor device. Digital system 300 includes, shown in the background, components of a CPU, which has similar components as CPU 100 in FIG. 1. These components include a program counter 110, an instruction memory 120, a clock generation circuit 130, a bus 140, a control unit 150, an arithmetic logic unit (ALU) 160, a data memory 170, and a memory control unit 180. Digital system 300 includes a system clock signal, which sends out a clock signal to synchronize the operation of all components in the digital system. The system clock is characterized by a system clock period or, equivalently, a system clock frequency. Further, digital system 300 includes a digital ring oscillator (DRO) cluster having a plurality of DRO cells 310 and a DRO control circuit 320. Each of the plurality of DRO cells 310 is coupled to a voltage node disposed at a different location in digital system 300 for producing a local ring oscillator clock signal having a ring oscillator clock period that is shorter than the system clock period. The DRO cluster is configured to measure the speed of the respective ring oscillator in each of the plurality of DRO cells during a time window synchronized to the system clock. The measured ring oscillator clock speed can be used for inferring local voltage variation in a digital system.

In FIG. 3, a number of DRO cells 310 are shown disposed at different locations in digital system 300. The placement of DRO cells 310 in FIG. 3 is merely for illustration purposes. In some embodiments, these locations can be selected based on static simulation analysis or previous test results that identify regions in the system that are more prone to IR drops. Each DRO cell 310 includes a ring oscillator for determining a DRO clock count during a pre-set time window, and each DRO cell 310 provides a trigger signal if the ring oscillator count is below a minimum threshold value. Control circuit 320 is coupled to each of the DRO cells 310 for providing an enable signal to each DRO cell 310 for synchronizing DRO clock counting to the system clock of the digital system. Control circuit 320 also receives the trigger signal from each of the DRO cells 310. In some embodiments, the DRO cluster also includes a test circuit 330 for coupling the plurality of the DRO in series for providing control parameters to DRO cells 310 and outputting DRO clock count results from DRO cells 310.

Besides the digital ring oscillator, each DRO cell 310 also has circuitry to provide support functions, e. g., maintain the measuring windows, data sample and hold, and minimum detection, etc. Further, each DRO cell 310 can also have a low speed interface to a TAP (Test Access Port) chain (shown in dashed lines in FIG. 3) to operate programming of the parameters and results data collection. With this arrangement, the freeze/trigger signals are generated in real time but not read out in real time, so this simplifies the logic and bandwidth requirements for the DRO cells dramatically. The DRO cell can also contain reset synchronization logic and asynchronous TAP signals synchronization logic for main enable/disable logic.

In the DRO cells 310 described above, the ring oscillator is used to identify variations in ring oscillator clock speed at various locations of the digital system. Therefore, each DRO cell includes a fast ring oscillator, which oscillates at a higher frequency than the system clock of the digital system, with a corresponding shorter clock period. The fast ring oscillator can be formed with, for example, a low number of inverters implemented with small and fast MOS transistors. As a specific embodiment, the ring oscillator can include three inverters implemented with the fast MOS transistors supported by the available processing technology.

Embodiments of the disclosed technologies also provide a synchronization mechanism in the DRO cluster to allow the digital system to measure ring oscillator clock counts simultaneously at different locations and close to the same time or synchronously freeze the DRO cluster (i.e., the DRO cells) once a low-voltage triggering event is identified at one of the DRO cells. Further, the ring oscillator clock counts for each DRO cell is stored over a period of time (e.g., in a first-in, first-out (FIFO) buffer) preceding the triggering event. Thus, snapshots of the voltage variation over the system for a period of time are available to facilitate diagnosis of the failure. The techniques can be applied to digital system, such as a CPU, a processor, or a system-on-a-chip (SoC), etc., operating at a speed of, for example, 1 GHz (Gighertz) or higher.

Figure 4:
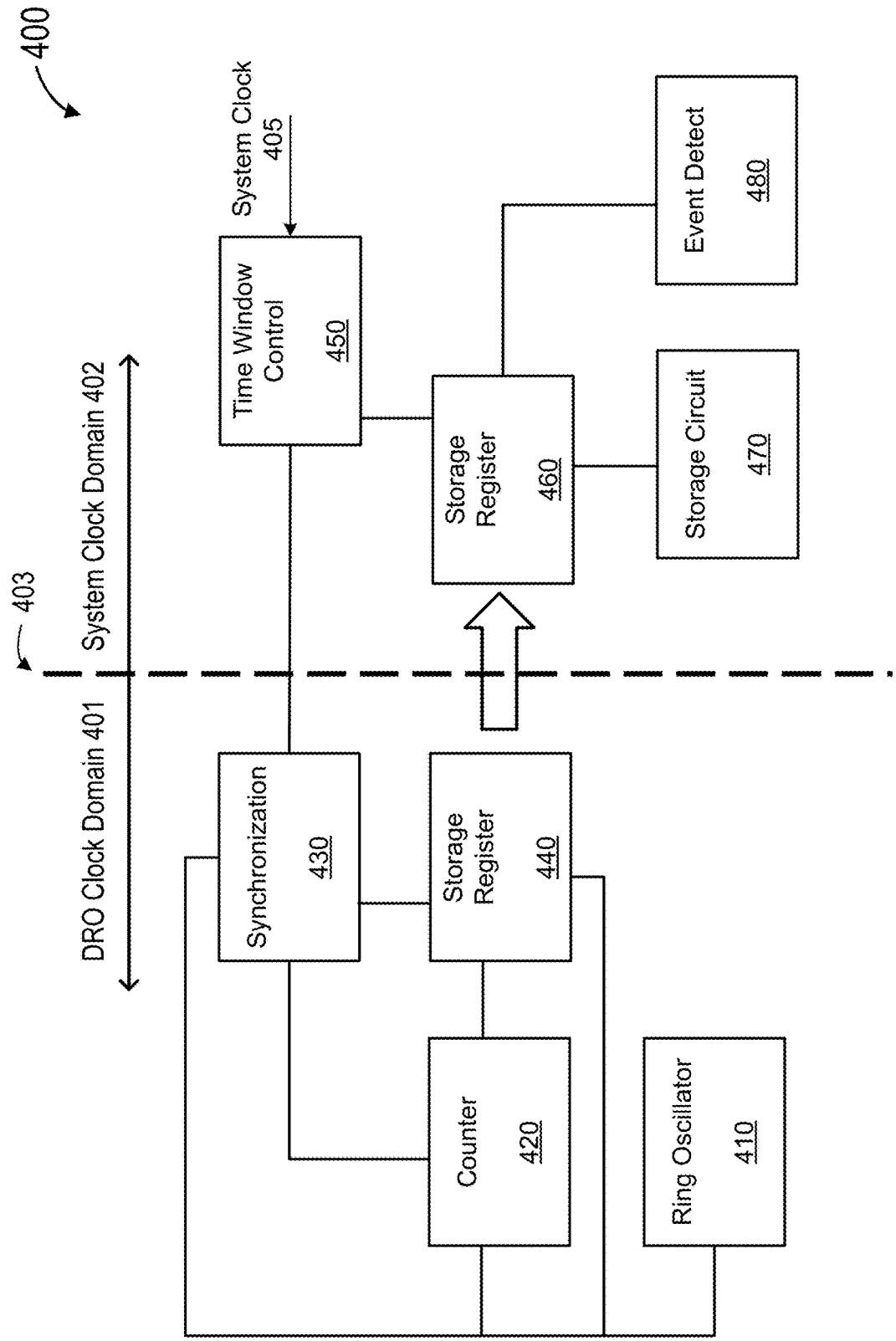
FIG. 4 is a simplified block diagram illustrating a digital ring oscillator (DRO) cell according to an example embodiment.

FIG. 4 is a simplified block diagram illustrating a digital ring oscillator (DRO) cell according to an example embodiment. The DRO cell of FIG. 4 may represent an example DRO cell 310 in FIG. 3. As shown in FIG. 4, DRO cell 400 includes a ring oscillator 410 that provides a clock signal in a DRO clock domain 401. DRO cell 400 also receives a system clock signal 405 in a system clock domain 402. In certain embodiments, the system clock signal 405 may be the operating clock for the digital system 300 in FIG. 3. In FIG. 4, the logic boundary between DRO clock domain 401 and system clock domain 402 is indicated by a line 403. In DRO clock domain 401, DRO cell 400 also includes a synchronization circuit 430 for receiving a new window signal from system clock domain 402, and a counter circuit 420 for counting the number of ring oscillator clocks within the window in response to the new window signal. A storage register 440 receives the counter output. In the system clock domain, DRO cell 400 also includes a time window circuit 450 for producing the new window signal, and a storage register 460 for receiving and storing ring oscillator clock counts from the counter circuit. In the system clock domain, DRO cell 400 also includes a storage circuit 470 for recording the ring oscillator clock counts over a number of system clocks. DRO cell 400 further includes an event detection circuit 480 for comparing the ring oscillator clock counts with a minimum value to produce the trigger signal. Further details of the DRO cluster and DRO cells are described below in connection with FIGS. 5-11.

In some embodiments, for supporting wide monitoring options, programmable TAP (Test Access Port) registers are provided to support programming of wide range of values to the different system configurations such as measuring window size and minimum count threshold. In some embodiments, the DRO cluster external interface is IEEE STD 1149.1-1990, IEEE Standard Test Access Port (TAP) and Boundary-Scan Architecture compliant and can be activated by standard on-chip test TAP to control the execution of the processor, and to debug the software.

Figure 5:
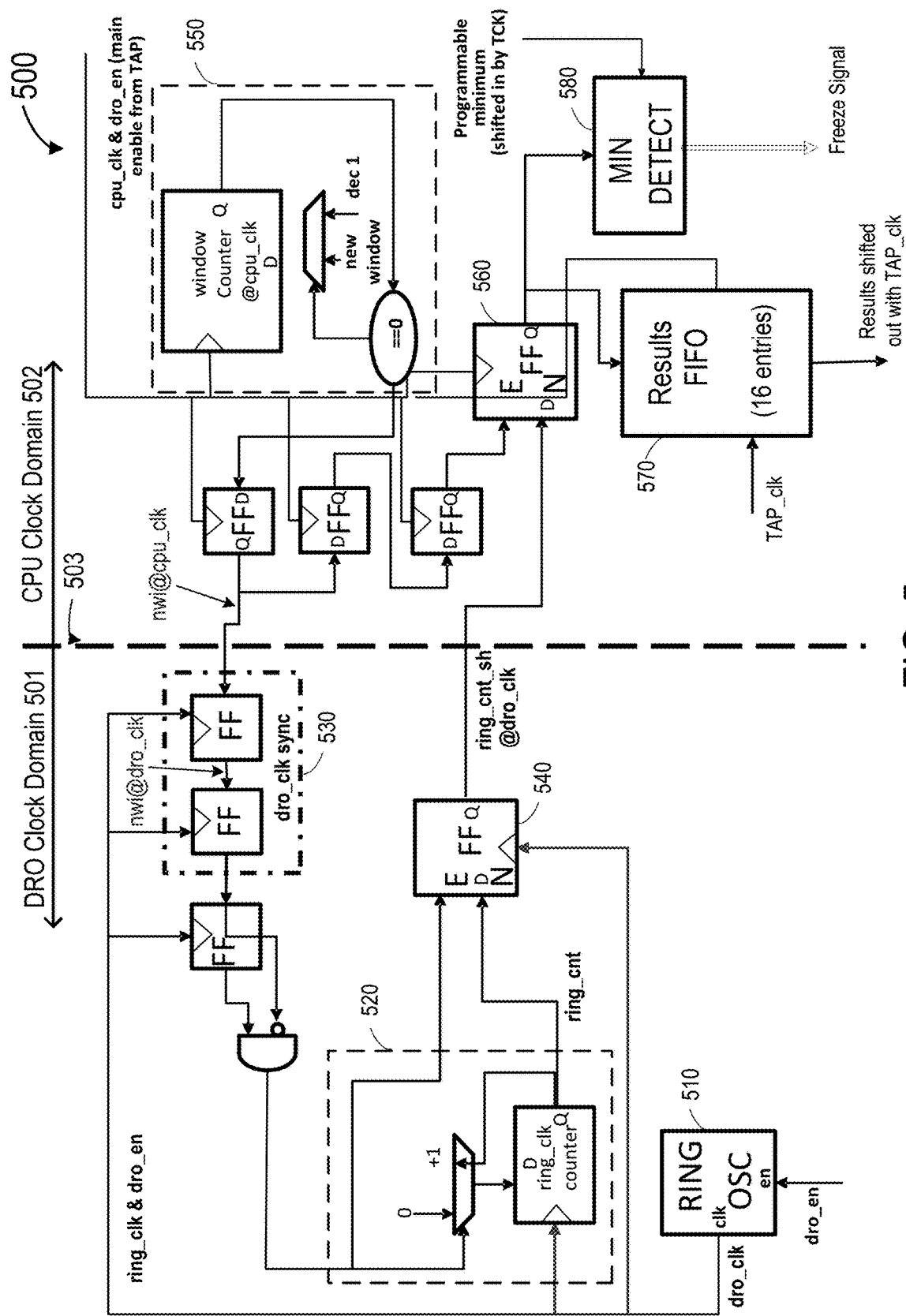
FIG. 5 is a simplified block diagram illustrating a digital ring oscillator (DRO) cell according to another example embodiment.

FIG. 5 is another simplified schematic diagram of a digital ring oscillator (DRO) cell according to an example embodiment. Digital ring oscillator (DRO) cell 500 includes a DRO clock domain 501 and a CPU clock domain 502. The logic boundary between DRO clock domain 501 and CPU clock domain 502 is indicated by a line 503.

In DRO clock domain 501, a digital ring oscillator (DRO) 510 is coupled to a local supply voltage (not shown) and is configured to oscillate and generate a clock signal label dro_clk. A counter circuit 520 is used to count the number of DRO clock signals in a pre-set time window. The timing window for counting is reset by a new window indication signal nwi@cpu_clk from CPU clock domain 502. A dro-clk sync circuit 530 receives the new window indication signal and produces a new window indication signal nwi@dro_clk synchronized to the DRO clock, which is used to control counter circuit 520. A signal ring_cnt in FIG. 5 is the output of digital counter 520 and indicates the number of DRO clocks in a given time window. The signal_ring_cnt is latched in a flip flop storage register 540, which provides an output ring_cnt_sh@dro_clk to be transferred to a storage in CPU time domain 502.

In CPU clock domain 501, a window control circuit 550 generates the new window indication signal nwi@cpu_clk to trigger the counting of the DRO clocks in the DRO clock domain. A flip flop storage register 560 receives the output ring_cnt_sh@dro_clk from DRO clock domain 501 and feeds the output signal to a result FIFO (first-in first-out shift register) storage register 570. A min detect circuit 580 compares the DRO clock counts with a pre-set minimum value and produces a freeze signal 590 if the DRO clock falls below the per-set minimum value.

Storage register 570 is a FIFO (first-in first-out shift register), in which the oldest data entry is shifted out first. A FIFO register can be used to continuously accept input data and shift out old data to maintain the most current data. In the example of FIG. 5, the results FIFO 570 provides storage for the latest 16 clock counts. Other components in DRO cell 500 can be implemented using known techniques. For example, synchronization circuit 530 can be implemented using flip-flops and delay elements. Counter circuits 520 and 550 can be implemented using standard logic circuit. Min detect circuit 580 can be implemented with a comparator circuit. Further details of the operation of DRO cell 500 are described below with reference to FIG. 6.

Figure 6:
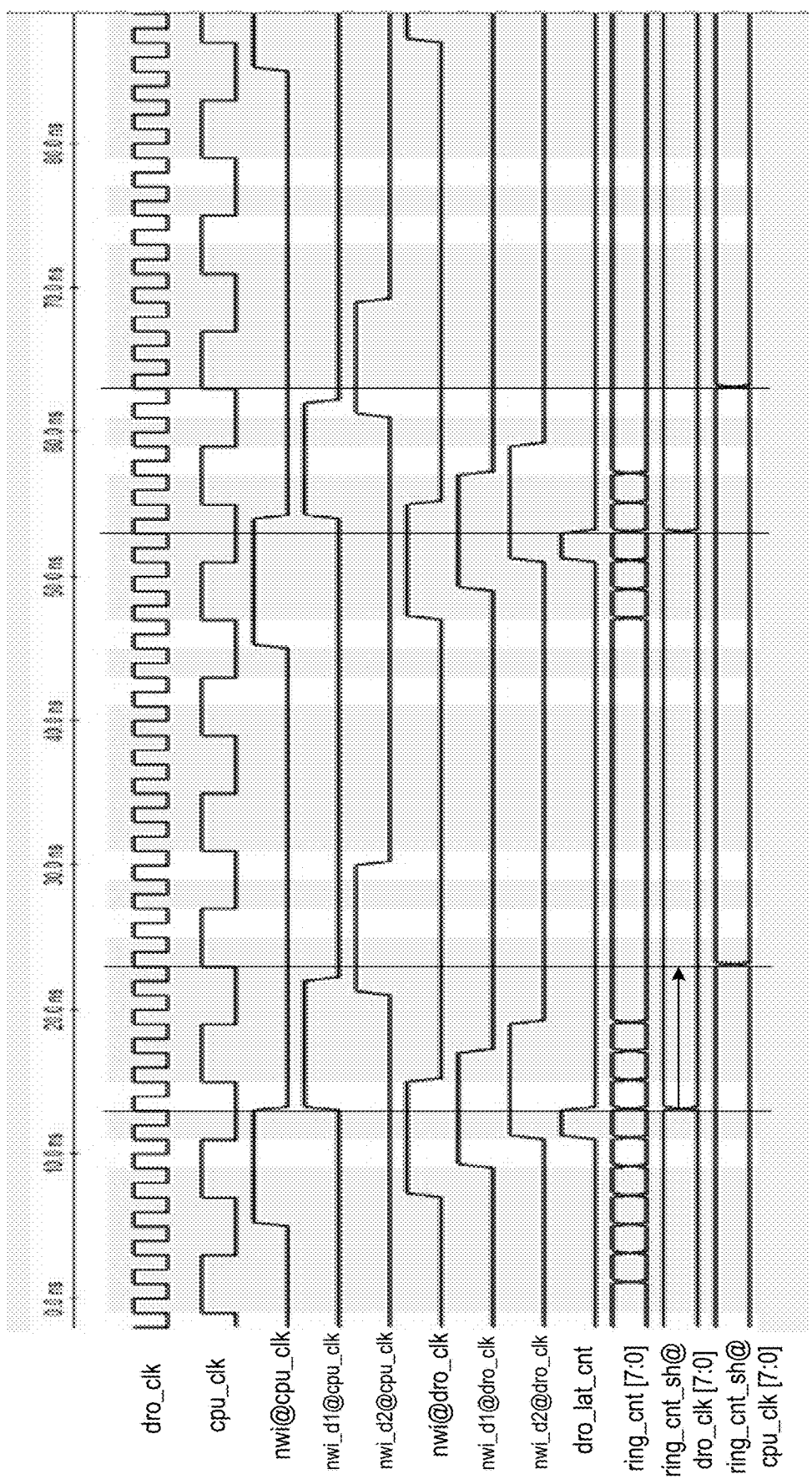
FIG. 6 is a waveform diagram illustrating the operation of the digital ring oscillator (DRO) cell of FIG. 5 according to an example embodiment.

FIG. 6 shows waveforms illustrating various signals in a DRO cell according to an example embodiment. As described above, the system keeps track of the number of DRO clock cycles in a specific time window and uses it to determine the local DRO clock speed, which is used as a representation of the local voltage to which the DRO is attached. The variation in the local voltage can be used as a measure of the voltage drop along a signal path.

FIG. 6 shows waveforms for various signals operating to generate system clock synchronous ring counters. In this example, the CPU clock has a period of 8 nano seconds (nsec), and the DRO clock has a period of 2 nsec, and the counting time window has a duration of five CPU clocks. Therefore, during a single window of five CPU clocks, the nominal count of the DRO clock should be 20. The variation of the DRO clock counts for the various DRO cells placed in the CPU, e. g., 19, 18, or 16 counts in a window, represents the variation of the local voltage in different regions of the CPU. Since variation of local voltages can be caused by the dynamic operation of the system, it is desirable to be able to trace the voltage drop off to the CPU clock cycle causing the problem. Therefore, the counting of the DRO cycles is made synchronous to the CPU clock or system clock.

In some embodiments, the ring oscillator frequency can be 10 GHz or higher. There are several programmable parameters. For example, in certain embodiments, the programmable time window size can have a duration of 2-63 CPU clocks. The DRO ring clock counter can support counting up to 255 ring oscillator clocks in a window. The programmable minimum threshold value can be 1 to 255 ring oscillator clocks per window. In the example of FIG. 5, the results FIFO 570 provides storage for the latest 16 clock counts. Of course, these parameters can be varied depending on the specific application.

In FIG. 6, the first waveform is labeled "dro_clk" and illustrates the oscillation of a DRO with a period of 2 nsec. The second waveform is labeled "cpu_clk" and illustrates the CPU clock with a period of 8 nsec. The waveform labeled nwi@cpu_clk is a new window indication (nwi) in the CPU clock domain, and the waveform label labeled nwi@dro_clk is a new window indication (nwi) synchronized in the DRO clock domain. These two signals are marked in FIG. 5 (DRO-cell) across the boundary between the CPU clock domain and the DRO clock domain. There are two auxiliary timing signals, nwi_d1@cpu_clk and nwi_d2@cpu_clk, that are first and second delayed new window indication signals used in timing synchronization in the CPU clock domain. Similarly, two auxiliary timing signals nwi_d1@dro_clk and nwi_d2@dro_clk are first and second delayed new window indication signals used in timing synchronization in the DRO clock domain. CPU clock, CPU clock domain and other references to CPU in FIG. 6 and generally in other figures are meant to illustrate a specific embodiment, is non-limiting and extend to any digital system.

Figure 7:
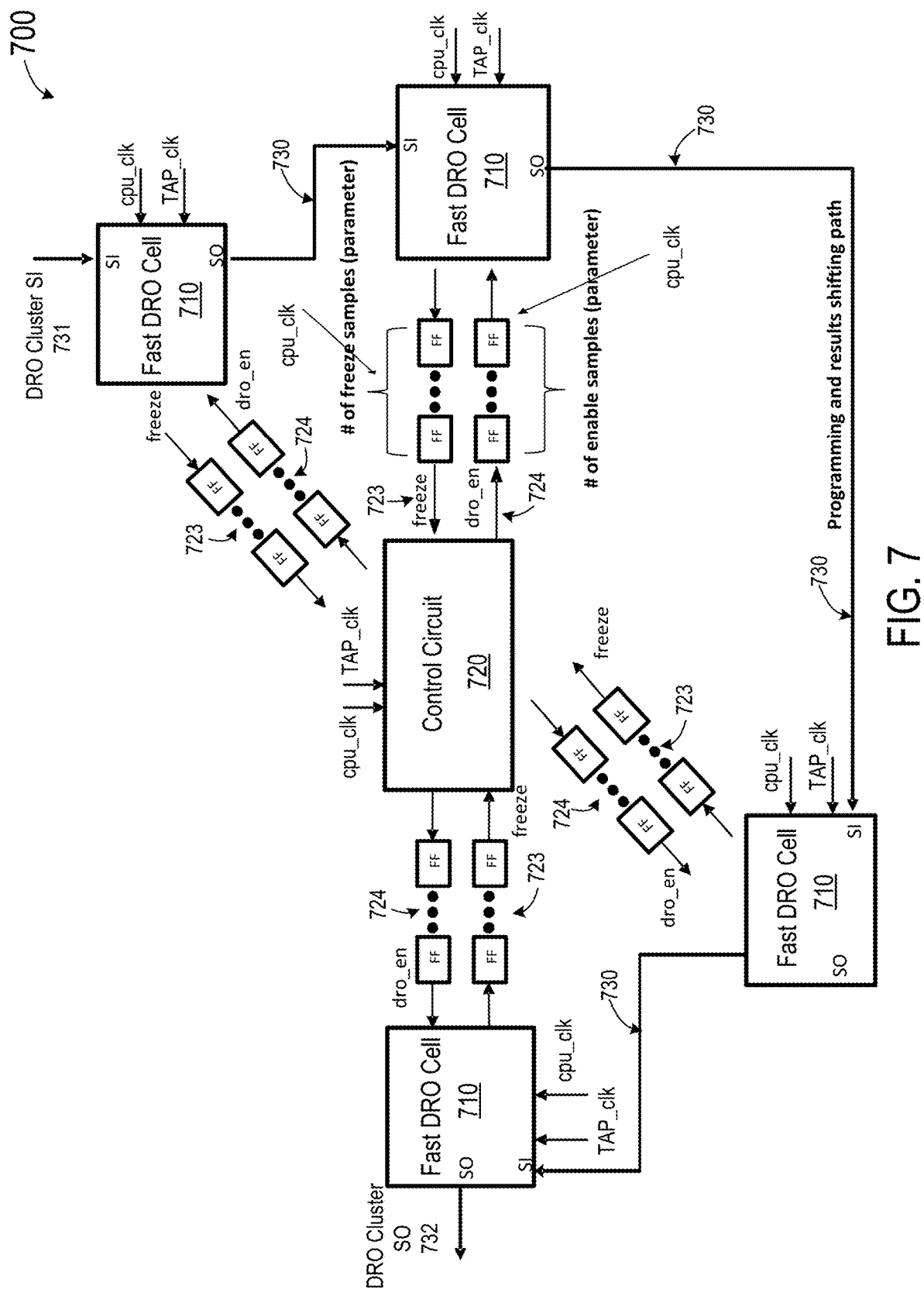
FIG. 7 is a simplified block diagram illustrating a digital ring oscillator (DRO) cluster according to an example embodiment.

FIG. 7 is a simplified block diagram illustrating a digital ring oscillator (DRO) cluster according to an example embodiment. As shown in FIG. 7, DRO cluster 700 includes a plurality of digital ring oscillator (DRO) cells 710. DRO cells 710 are configured to be disposed at different locations in a digital system, e. g., a CPU, a processor, or a system-on-a-chip (SoC), etc. In this example, a CPU is used for illustration. DRO cluster 700 also includes a control circuit 720 coupled to each of the DRO cells 710 for issuing an enable signal dro_en to each of the DRO cells 710 and for receiving a trigger signal. The trigger signal is labeled "freeze" in the embodiment of FIG. 7, and is used to stop the DRO cell operation. DRO cells 710 and control circuit 720 receive a cpu_clk and a TAP_clk. The cpu_clock is the system clock of the digital system, and TAP_clk is the clock for an asynchronous test circuit. In some embodiments, such a test circuit can be implemented using TAP (Test Access Port) as a means to control the execution of the processor, and to debug software according to IEEE Std 1149.1-1990 IEEE Standard Test Access Port and Boundary-Scan Architecture. As shown in FIG. 7, control circuit 720 also receives a cpu_clk and a TAP_clk.

As described above in connection with FIGS. 4, 5 and 6, each DRO cell 710 includes a ring oscillator coupled to a voltage node to generate a local ring oscillator clock. Each DRO cell 710 receives a cpu_clk and a TAP_clk. The cpu_clock is the system clock of the digital system, and the TAP clock is the clock for an asynchronous test circuit, test access port (TAP). The timing of DRO cell 710 is synchronized such that the counting of the ring register clocks in each DRO cell 710 is carried out simultaneously in response to a new window signal synchronized to a system clock. The count of ring oscillator clocks in each DRO cell 710 is stored in a local FIFO storage. Further, if a count of a ring oscillator clock in a DRO cell 710 falls below a pre-set minimum value, a trigger signal is produced. In FIG. 7, the trigger signal is labeled freeze.

Figure 8:
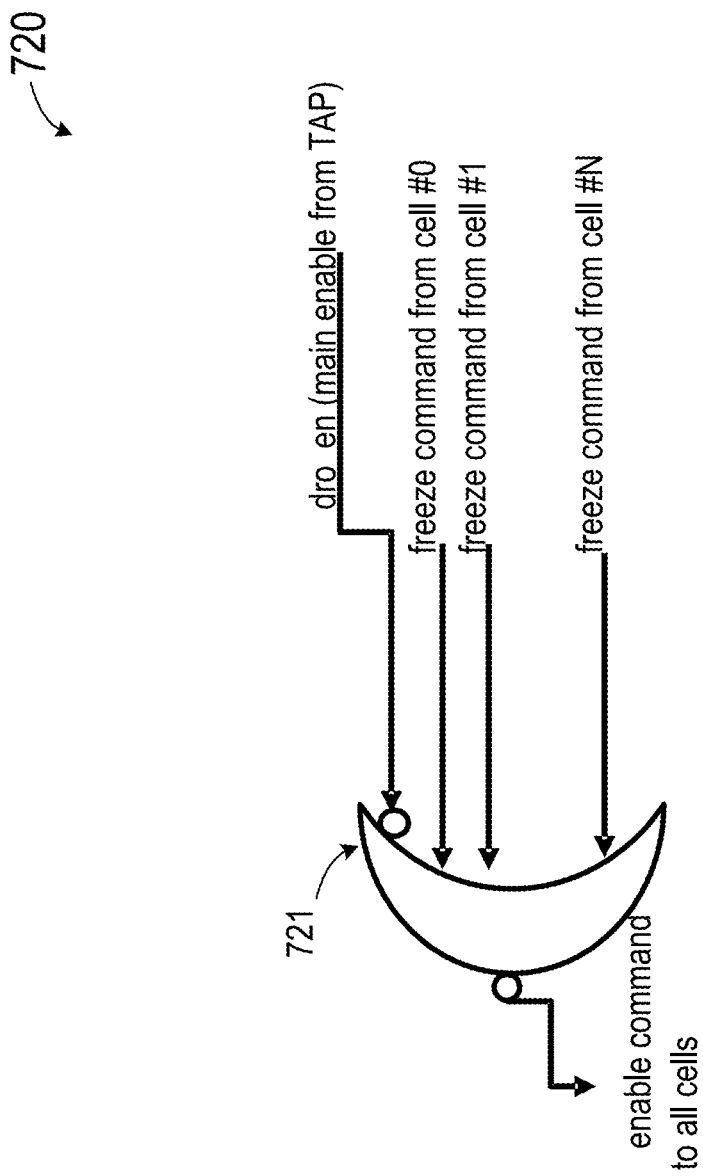
FIG. 8 is a simplified block diagram illustrating control circuit of the digital ring oscillator (DRO) cluster according to an example embodiment.

An example of control circuit 720 is shown in FIG. 8. In this embodiment, control circuit 720 includes a NOR circuit 721 that receives the trigger signal "freeze" from each of the DRO cells 710 in FIG. 7. Control circuit 720 also receives a main enable signal dro_en from the test control circuit TAP. If the trigger signals from all DRO cells 710 are turned off, or are at a logical low, and the main enable signal is a logical high, control circuit can enable signal dro_en to all DRO cells. Enable signal dro_en starts the operation in each DRO cell 710, e. g., causing the ring oscillator to oscillate, starting a new window for ring oscillator clock counting, storing the ring oscillator clock count, comparing the ring oscillator clock count with a pre-set minimum value, and producing a trigger signal if the count is below the pre-set minimum. If a trigger signal is received from any of the DRO cells, the enable commands to all DRO cells are turned off.

As shown in FIG. 7, DRO cluster 700 also shows two flip-flop chains, 723 and 724, coupled between control circuit 720 and the DRO cells 710 for synchronization of signal transfer. Since the distance between a DRO cell 710 and control circuit 720 can vary, these flip-flop chains are used for synchronization of signal transfer. For this purpose, flip-flop chains 723 and 724 each has the same number of flip-flops. In some embodiments, the number of flip-flops is a programmable parameter. Flip-flop chain 723 is used to transfer the trigger signal "freeze" from each DRO to control circuit 720, and flip-flop chain 724 is used to transfer the enable signal "DRO_en" from control circuit 720 to each DRO 710.

If the trigger signal from any one of the DRO cells 710 is turned on, control circuit 720 turns off the enable signal dro_en. As a result, the operation of all DRO cells 710 is stopped. At this point, the trigger signal is set when a ring oscillator count is below the pre-set minimum, indicating that a certain processor event has occurred that causes the speed of the ring oscillator to drop below an acceptable level. A system interrupt can be started to handle this situation. For example, the test circuit can be used to debug hardware and software.

The test control circuit in DRO cluster 700 can include a processor and software configured to set control parameters for various components in DRO cluster 700 and for reading the ring oscillator clock counts in the FIFO storage of each DRO 710. For simplicity, these components are not shown in FIG. 7. In the example of FIG. 7, the test control circuit includes a connection circuit that serially connects the DRO cells 710. The test control circuit runs on a TAP clock, TAP-clk, which is a low speed clock compared with the system clock. As shown in FIG. 7, control circuit 720 and each DRO cell 710 also receives the TAP_clk signal. For example, control circuit 720 receives the main enable circuit from the test control circuit for starting the operation of the DRO cells 710.

In the test control circuit, DRO cluster 700 has an input 731, DRO cluster serial input (SI), and an output 732, DRO cluster serial output (SO). Each DRO cell 710 has a test circuit input SI and a test circuit output SO. Various programmable parameters are passed from DRO cluster SI 731 to each DRO cell 710 serially. These parameters include time window size and minimum threshold value, etc.

Further, after the DRO cell 710 is stopped by a trigger signal, the ring oscillator clock counts stored in the FIFO storage of each DRO cell 710 are shifted out serially through connection circuit 730. The information can be used to isolate the trigger event to a location in the digital system hardware and a system clock cycle or a program counter for identifying an operation in the software.

Figure 9:
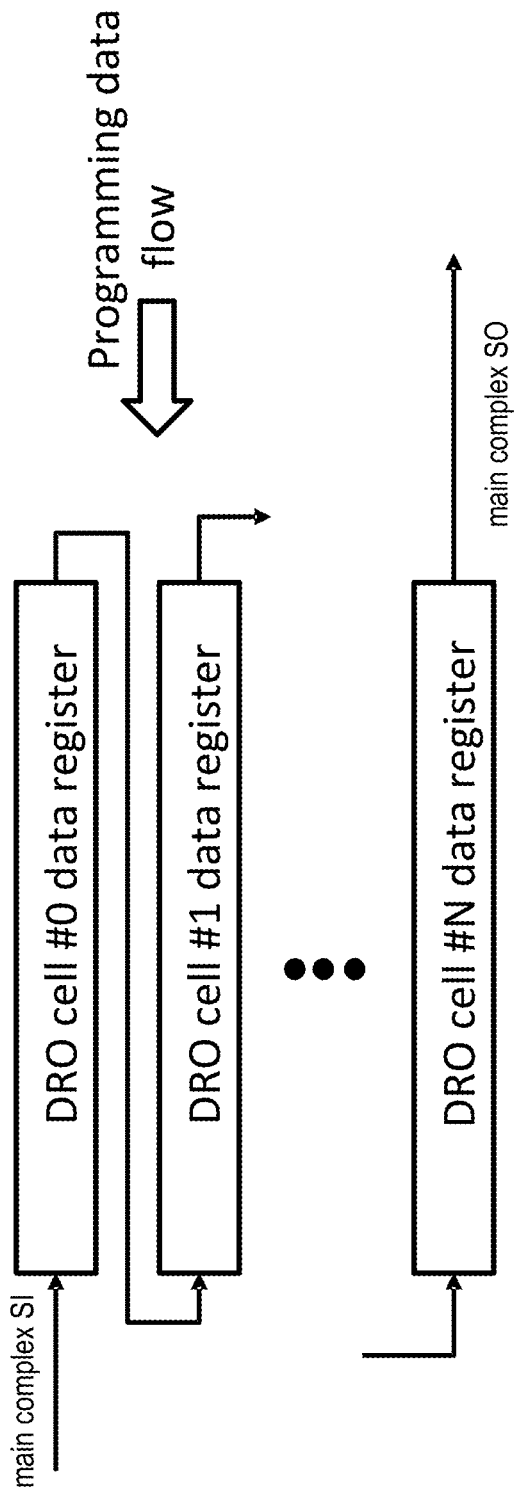
FIG. 9 is a simplified block diagram illustrating a programming operation of the digital ring oscillator (DRO) cluster according to an example embodiment.

FIG. 9 is a simplified block diagram illustrating programming data flow in a DRO cluster according to an embodiment. As shown, DRO cells #0, #1, . . . , # N are coupled in series in a TAP circuit. Programmable parameters in the DRO cluster include time window size and min threshold value, etc. Programming data enters the DRO cluster through input, DRO cluster SI, and passes through data registers in DRO cells #0, #1, . . . , # N serially. As an example, depending on the time window size, each time window can have up to 256 ring oscillator clock cycles.

Figure 10:
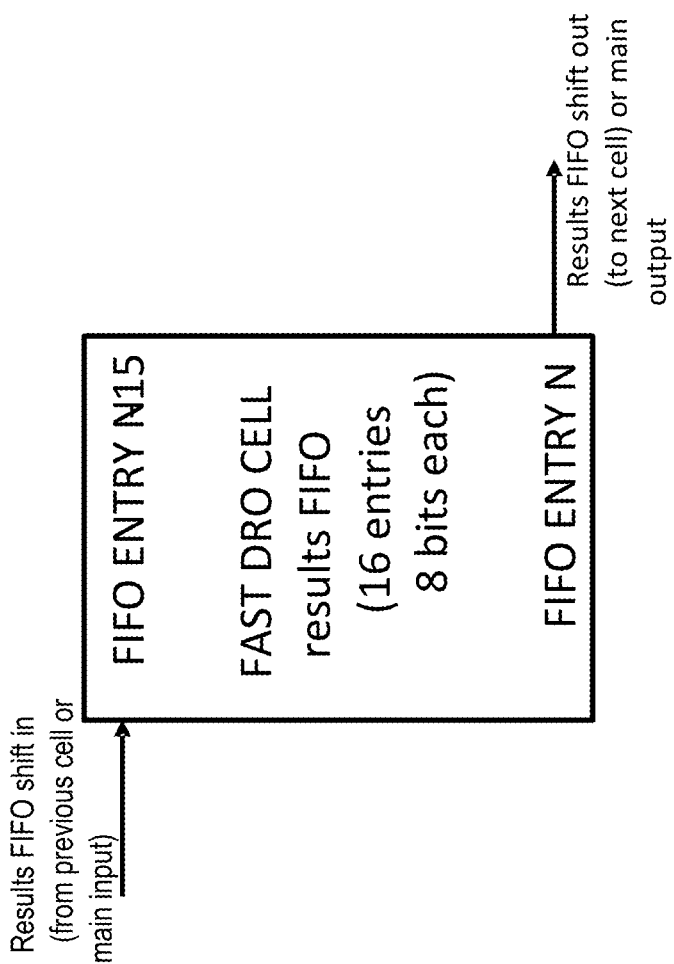
FIG. 10 is a simplified block diagram illustrating a result readout operation of the digital ring oscillator (DRO) cluster according to an example embodiment.

FIG. 10 is a simplified block diagram illustrating a FIFO storage in a DRO cell according to an embodiment. In an example, the FIFO storage has 16 entries, each entry having eight bits for a ring oscillator clock count. Depending on the application, the number of entries in the FIFO storage can be varied. These stored data are a record of the most recent ring oscillator clock counts. The DRO cluster trigger signal is synchronized to the CPU clock (system clock) and is also provided to a main interrupt handler, or a trace and debug logic, of the digital system, such as a processor or SoC. When the 'freeze' event is detected, the main interrupt handler can log the CPU time-stamp. The main interrupt logic can also freeze part or all system in addition to the DRO system in order to maintain any existing debug or trace logic for further system debugging. These capabilities can enable tracing the event with respect to CPU and program state the program counter.

Figure 11:
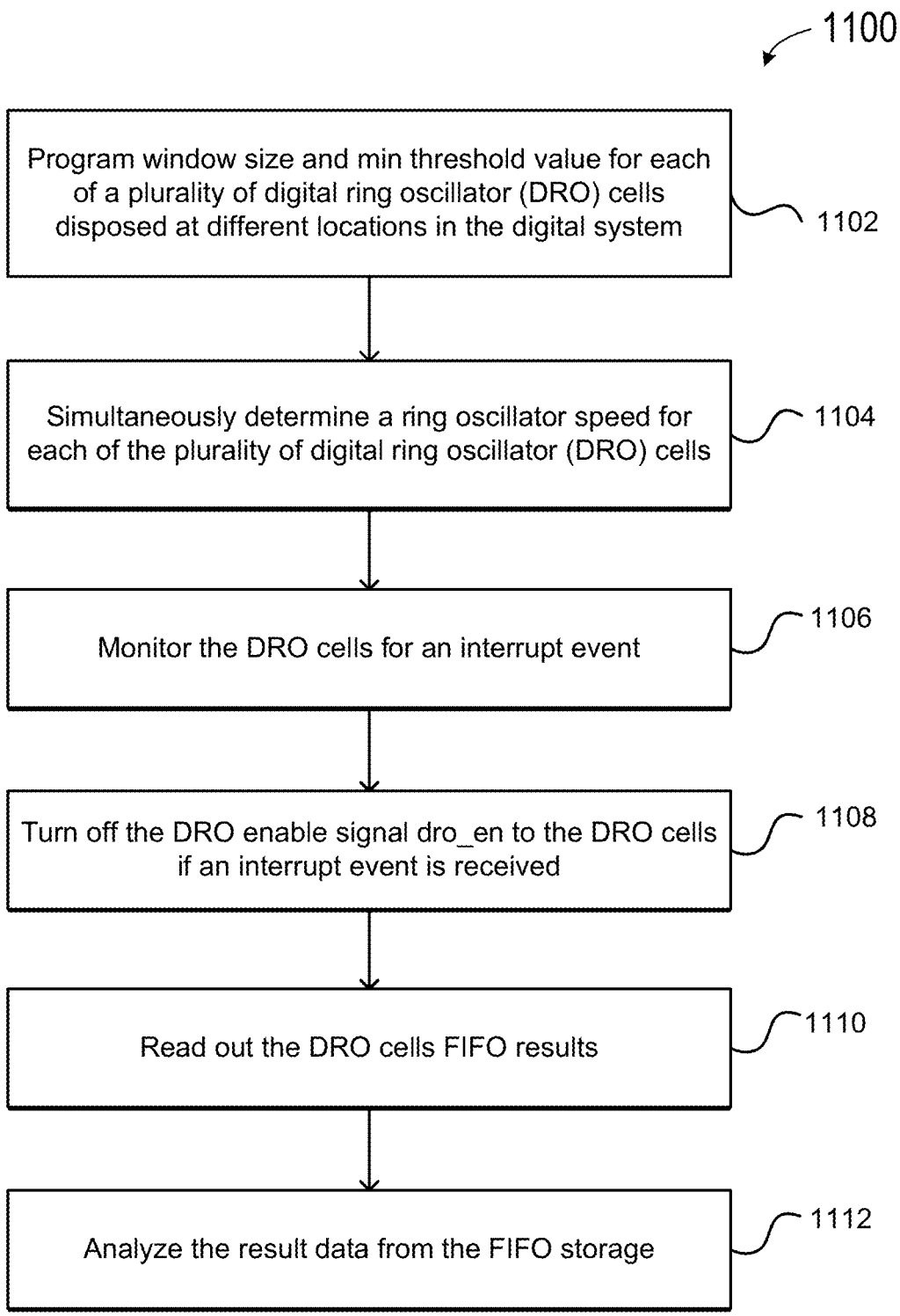
FIG. 11 is a simplified flowchart illustrating a method for detecting local speed drop in a digital system according to an example embodiment.

FIG. 11 is a simplified flowchart illustrating a method for detecting local speed drop in a digital system according to an example embodiment. An example digital system is described above in connection with FIGS. 2-10. For example, FIG. 3 is a simplified block diagram illustrating a digital system 300 including a digital ring oscillator (DRO) cluster for determining local voltage variation according to an example embodiment. FIG. 3 illustrates, in the background, components of digital system 300, which has various functional components. These components include a program counter 110, an instruction memory 120, a clock generation circuit 130, a bus 140, a control unit 150, an arithmetic logic unit (ALU) 160, a data memory 170, and a memory control unit 180. Digital system 300 includes a system clock signal having a system clock period. Further, digital system 300 includes a digital ring oscillator (DRO) cluster having a plurality of DRO cells 310 and a DRO control circuit 320. Each of the plurality of DRO cells 310 is coupled to a voltage node disposed at a different location in digital system 300 for producing a local ring oscillator clock signal having a ring oscillator clock period that is shorter than the system clock period. The DRO cluster is configured to measure the speed of the respective ring oscillator in each of the plurality of DRO cells during a time window synchronized to the system clock. The measured ring oscillator clock speed can be used for determining local voltage variation in a digital system. More details of the DRO cluster and DRO cells are described above with reference to FIGS. 4 to 8.

The method 1100 for detecting local speed drop in a digital system includes simultaneously determining a ring oscillator speed for each of a plurality of digital ring oscillator (DRO) cells disposed at different locations in the digital system, and producing a trigger signal if the count in any of the DRO cells falls below a reference value.

As shown in the flowchart of FIG. 11, method 1100 for detecting local speed drop in a digital system includes programming window size and min threshold value for each DRO cell (process 1102). As described above, the number of ring oscillator clock counts is determined during a time window determined by the programmable window size parameter. The min threshold value is used to determine if a ring oscillator count has fallen too low to represent a problem to be handled. In the example described above in connection with FIG. 6, the counting time window has a duration of five CPU clocks, and during a single window of five CPU clocks, the nominal count of the DRO clock is 20. The variation of the DRO clock counts for the various DRO cells placed in the CPU, e. g., 19, 18, or 16 counts in a window, represents the variation of the local voltage in different regions of the CPU. In this example, the min threshold value may be set to 17, if a DRO clock count of 17 is associated with a CPU failure. These programmable values can be set in the DRO cells through the TAP test circuit.

Method 1100 also includes simultaneously determining a ring oscillator speed for each of the digital ring oscillator (DRO) cells disposed at different locations in the digital system (process 1104). As shown in FIGS. 7 and 8, the main fast_dro enable signal is turned on in control circuit 720, which sends the dro_en signal to all the DRO cells simultaneously to start the ring oscillator clock counting in the DRO cells synchronously.

Method 1100 also includes monitoring the DRO cells for an interrupt event (process 1106) caused by a trigger signal generate by a DRO cell if the count in that DRO cells falls below a reference value.

Method 1100 also includes turning off the DRO enable signal dro_en to the DRO cells if an interrupt event is received (process 1108). As shown in FIG. 8, control circuit 720 in the DRO cluster includes a NOR circuit 721 that receives the trigger signal "freeze" from each of the DRO cells 710 in FIG. 7. Control circuit 720 also receives a main enable signal dro_en from the test control circuit TAP. If the trigger signals from all DRO cells 710 are turned off, or are at a logic low, and the main enable signal is high, control circuit produces can enable signal dro_en to all DRO cells. Enable signal dro_en starts the operation in each DRO cell 710, e. g., causing the ring oscillator to oscillate, starting a new window for ring oscillator clock counting, storing the ring oscillator clock count, comparing the ring oscillator clock count with a pre-set minimum value, and producing a trigger signal if the count is below the pre-set minimum. If a trigger signal is received from any of the DRO cells, the enable commands to all DRO cells are turned off.

Method 1100 further includes reading out the DRO cells FIFO results, by shifting out the serial chain under the control of the TAP circuit (Process 1110). The FIFO storage circuit described in connection with FIGS. 5 and 10 a capacity to continuously store a number of ring oscillator clock counts.

Method 1100 further includes analyzing the result data from the FIFO storage (process 1112). These stored data are a record of the most recent ring oscillator clock counts and allow synchronization and correlation to the triggering event to the system clock. In some cases, the information can also be used to correlate to the program counter.

Some or all of the processes in method 1100 (or any other processes described herein, or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Figure 12:
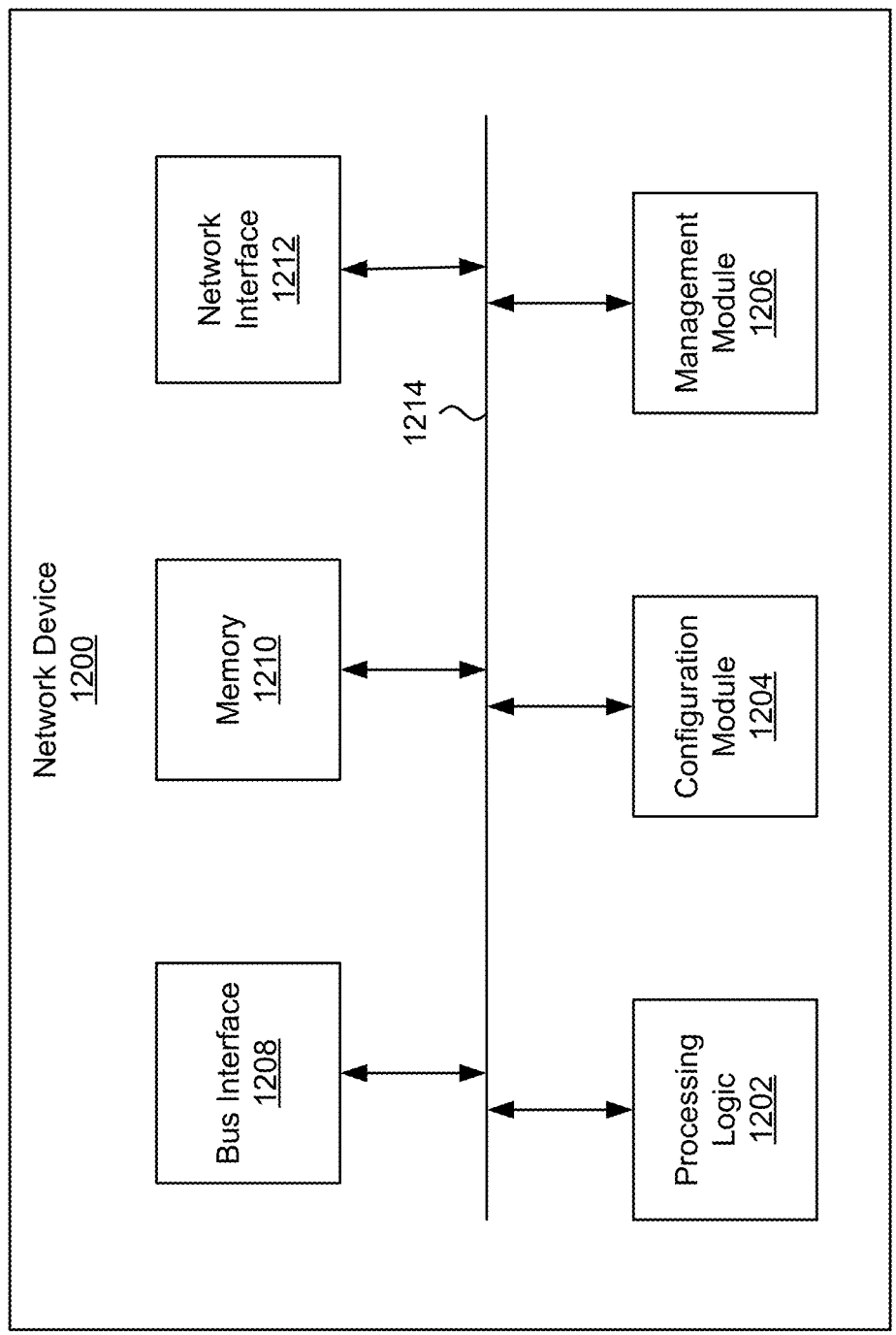
FIG. 12 illustrates an environment in which various embodiments can be implemented.

FIG. 12 illustrates an example of a network device 1200. Functionality and/or several components of the network device 1200 may be used without limitation with other embodiments disclosed elsewhere in this disclosure, without limitations. A network device 1200 may facilitate processing of packets and/or forwarding of packets from the network device 1200 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the network device 1200 may be the recipient and/or generator of packets. In some implementations, the network device 1200 may modify the contents of the packet before forwarding the packet to another device. The network device 1200 may be a peripheral device coupled to another computer device, a switch, a router or any other suitable device enabled for receiving and forwarding packets.

In one example, the network device 1200 may include processing logic 1202, a configuration module 1204, a management module 1206, a bus interface module 1208, memory 1210, and a network interface module 1212. These modules may be hardware modules, software modules, or a combination of hardware and software. In certain instances, modules may be interchangeably used with components or engines, without deviating from the scope of the disclosure. The network device 1200 may include additional modules, not illustrated here, such as components discussed with respect to the nodes disclosed in FIG. 13. In some implementations, the network device 1200 may include fewer modules. In some implementations, one or more of the modules may be combined into one module. One or more of the modules may be in communication with each other over a communication channel 1214. The communication channel 1214 may include one or more busses, meshes, matrices, fabrics, a combination of these communication channels, or some other suitable communication channel.

The processing logic 1202 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1202 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1202 may be stored on a computer-readable storage medium, for example, in the form of a computer program. The computer-readable storage medium may be non-transitory. In some cases, the computer-readable medium may be part of the memory 1210.

The memory 1210 may include either volatile or non-volatile, or both volatile and non-volatile types of memory. The memory 1210 may, for example, include random access memory (RAM), read only memory (ROM), Electrically Erasable Programmable Read-Only Memory (EEPROM), flash memory, and/or some other suitable storage media. In some cases, some or all of the memory 1210 may be internal to the network device 1200, while in other cases some or all of the memory may be external to the network device 1200. The memory 1210 may store an operating system comprising executable instructions that, when executed by the processing logic 1202, provides the execution environment for executing instructions providing networking functionality for the network device 1200. The memory may also store and maintain several data structures and routing tables for facilitating the functionality of the network device 1200.

In some implementations, the configuration module 1204 may include one or more configuration registers. Configuration registers may control the operations of the network device 1200. In some implementations, one or more bits in the configuration register can represent certain capabilities of the network device 1200. Configuration registers may be programmed by instructions executing in the processing logic 1202, and/or by an external entity, such as a host device, an operating system executing on a host device, and/or a remote device. The configuration module 1204 may further include hardware and/or software that control the operations of the network device 1200.

In some implementations, the management module 1206 may be configured to manage different components of the network device 1200. In some cases, the management module 1206 may configure one or more bits in one or more configuration registers at power up, to enable or disable certain capabilities of the network device 1200. In certain implementations, the management module 1206 may use processing resources from the processing logic 1202. In other implementations, the management module 1206 may have processing logic similar to the processing logic 1202, but segmented away or implemented on a different power plane than the processing logic 1202.

The bus interface module 1208 may enable communication with external entities, such as a host device and/or other components in a computing system, over an external communication medium. The bus interface module 1208 may include a physical interface for connecting to a cable, socket, port, or other connection to the external communication medium.

The bus interface module 1208 may further include hardware and/or software to manage incoming and outgoing transactions. The bus interface module 1208 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1208 may include the physical layer for any of these bus protocols, including a connector, power management, and error handling, among other things. In some implementations, the network device 1200 may include multiple bus interface modules for communicating with multiple external entities. These multiple bus interface modules may implement the same local bus protocol, different local bus protocols, or a combination of the same and different bus protocols.

The network interface module 1212 may include hardware and/or software for communicating with a network. This network interface module 1212 may, for example, include physical connectors or physical ports for wired connection to a network, and/or antennas for wireless communication to a network. The network interface module 1212 may further include hardware and/or software configured to implement a network protocol stack. The network interface module 1212 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the network device 1200 may include multiple network interface modules, each configured to communicate with a different network. For example, in these implementations, the network device 1200 may include a network interface module for communicating with a wired Ethernet network, a wireless 802.11 network, a cellular network, an Infiniband network, etc.

The various components and modules of the network device 1200, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 13.

Figure 13:
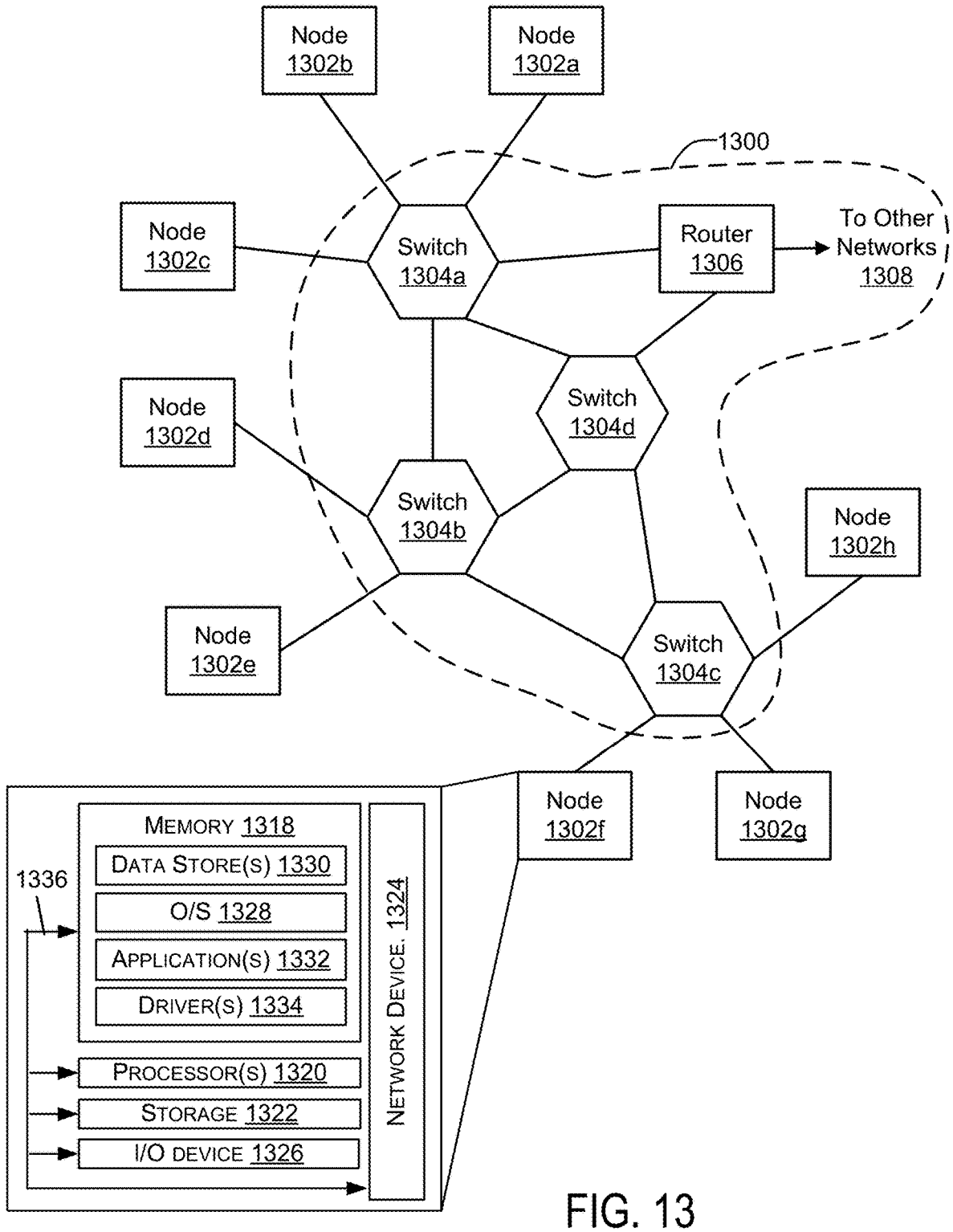
FIG. 13 illustrates an environment in which various embodiments can be implemented.

FIG. 13 illustrates a network 1300, illustrating various different types of network devices 1200 of FIG. 12, such as nodes comprising the network device, switches and routers. In certain embodiments, the network 1300 may be based on a switched architecture with point-to-point links. As illustrated in FIG. 13, the network 1300 includes a plurality of switches 1304*a*-1304*d*, which may be arranged in a network. In some cases, the switches are arranged in a multi-layered network, such as a Clos network. A network device 1200 that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 1304*a*-1304*d* may be connected to a plurality of nodes 1302*a*-1302*h* and provide multiple paths between any two nodes.

The network 1300 may also include one or more network devices 1200 for connection with other networks 1308, such as other subnets, LANs, wide area networks (WANs), or the Internet, and may be referred to as routers 1306. Routers use headers and forwarding tables to determine the best path for forwarding the packets, and use protocols such as internet control message protocol (ICMP) to communicate with each other and configure the best route between any two devices.

In some examples, network(s) 1300 may include any one or a combination of many different types of networks, such as cable networks, the Internet, wireless networks, cellular networks and other private and/or public networks. Interconnected switches 1304*a*-1304*d* and router 1306, if present, may be referred to as a switch fabric, a fabric, a network fabric, or simply a network. In the context of a computer network, terms "fabric" and "network" may be used interchangeably herein.

Nodes 1302*a*-1302*h* may be any combination of host systems, processor nodes, storage subsystems, and I/O chassis that represent user devices, service provider computers or third party computers.

User devices may include computing devices to access an application 1332 (e.g., a web browser or mobile device application). In some aspects, the application 1332 may be hosted, managed, and/or provided by a computing resources service or service provider. The application 1332 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 1308. Additionally, the user device(s) may be part of the distributed system managed by, controlled by, or otherwise part of the service provider computer(s) (e.g., a console device integrated with the service provider computers).

The node(s) of FIG. 13 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 1332 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 1302*a*-1302*h* may include at least one memory 1318 and one or more processing units (or processor(s) 1320). The processor(s) 1320 may be implemented in hardware, computer-executable instructions, firmware, or combinations thereof. Computer-executable instruction or firmware implementations of the processor(s) 1320 may include computer-executable or machine-executable instructions written in any suitable programming language to perform the various functions described.

In some instances, the hardware processor(s) 1320 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 1318 may store program instructions that are loadable and executable on the processor(s) 1320, as well as data generated during the execution of these programs. Depending on the configuration and type of the node(s) 1302*a*-1302*h*, the memory 1318 may be volatile (such as RAM) and/or non-volatile (such as ROM, flash memory, etc.). The memory 1318 may include an operating system 1328, one or more data stores 1330, one or more application programs 1332, one or more drivers 1334, and/or services for implementing the features disclosed herein.

The operating system 1328 may support nodes 1302*a*-1302*h* basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 1328 may also be a proprietary operating system.

The data stores 1330 may include permanent or transitory data used and/or operated on by the operating system 1328, application programs 1332, or drivers 1334. Examples of such data include web pages, video data, audio data, images, user data, and so on. The information in the data stores 1330 may, in some implementations, be provided over the network(s) 1308 to user devices 1304. In some cases, the data stores 1330 may additionally or alternatively include stored application programs and/or drivers. Alternatively or additionally, the data stores 1330 may store standard and/or proprietary software libraries, and/or standard and/or proprietary application user interface (API) libraries. Information stored in the data stores 1330 may be machine-readable object code, source code, interpreted code, or intermediate code.

The drivers 1334 include programs that may provide communication between components in a node. For example, some drivers 1334 may provide communication between the operating system 1328 and additional storage 1322, network device 1324, and/or I/O device 1326. Alternatively or additionally, some drivers 1334 may provide communication between application programs 1332 and the operating system 1328, and/or application programs 1332 and peripheral devices accessible to the service provider computer. In many cases, the drivers 1334 may include drivers that provide well-understood functionality (e.g., printer drivers, display drivers, hard disk drivers, Solid State Device drivers). In other cases, the drivers 1334 may provide proprietary or specialized functionality.

The service provider computer(s) or servers may also include additional storage 1322, which may include removable storage and/or non-removable storage. The additional storage 1322 may include magnetic storage, optical disks, solid state disks, flash memory, and/or tape storage. The additional storage 1322 may be housed in the same chassis as the node(s) 1302*a*-1302*h* or may be in an external enclosure. The memory 1318 and/or additional storage 1322 and their associated computer-readable media may provide non-volatile storage of computer-readable instructions, data structures, program modules, and other data for the computing devices. In some implementations, the memory 1318 may include multiple different types of memory, such as SRAM, DRAM, or ROM.

The memory 1318 and the additional storage 1322, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 1318 and the additional storage 1322 are examples of computer storage media. Additional types of computer storage media that may be present in the node(s) 1302a-1302h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 1302a-1302h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 1302a-1302h may also include I/O device(s) 1326, such as a keyboard, a mouse, a pen, a voice input device, a touch input device, a display, speakers, a printer, and the like. The node(s) 1302a-1302h may also include one or more communication channels 1336. A communication channel 1336 may provide a medium over which the various components of the node(s) 1302a-1302h can communicate. The communication channel or channels 1336 may take the form of a bus, a ring, a switching fabric, or a network.

The node(s) 1302a-1302h may also contain network device(s) 1324 that allow the node(s) 1302a-1302h to communicate with a stored database, another computing device or server, user terminals and/or other devices on the network(s) 1300. The network device(s) 1324 of FIG. 13 may include similar components discussed with reference to the network device 1200 of FIG. 12.

In some implementations, the network device 1324 is a peripheral device, such as a PCI-based device. In these implementations, the network device 1324 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 1208 may implement NVMe, and the network device 1324 may be connected to a computing system using a PCIe interface.

A PCI-based device may include one or more functions. A "function" describes operations that may be provided by the network device 1324. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 1324 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 12, FIG. 13, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A semiconductor device, comprising:
a plurality of circuit components, each of the plurality of circuit components disposed at a respective different location in the semiconductor device;
a plurality of digital ring oscillator (DRO) cells, wherein each DRO cell of the plurality of DRO cells is disposed associated to a respective circuit component at a different location in the semiconductor device and each DRO cell includes a ring oscillator for determining a DRO clock count during a time window, and wherein each DRO cell is configured to store the DRO clock count and to provide a trigger signal based on the DRO clock count being below a minimum threshold value; and a control circuit, wherein the control circuit is coupled to each of the DRO cells for providing an enable signal to each of the DRO cells for synchronizing DRO clock counting in each of the DRO cells to a system clock of the semiconductor device, such that counting of ring oscillator clock signal in each DRO cell of the plurality of DRO cells is carried out simultaneously, the control circuit further configured for receiving the trigger signal from each of the DRO cells and, upon receiving the trigger signal, disabling all DRO cells and reading out the stored DRO clock count;
wherein the DRO cells are coupled in series for receiving control parameters to the DRO cells and outputting DRO clock count results from the DRO cells.

2. The semiconductor device of claim 1, wherein each of the DRO cells comprises the ring oscillator that provides a clock signal for a DRO clock domain and receives a system clock signal for a system clock domain, wherein each of the DRO cells further comprises:
in the DRO clock domain:
a synchronization circuit for receiving a new window signal from the system clock domain; and
a counter circuit configured for counting the DRO clock count within the window in response to the new window signal; and
in the system clock domain:
a time window circuit for producing the new window signal; and
a storage circuit for receiving and storing the DRO clock count from the counter circuit.

3. The semiconductor device of claim 2, wherein the storage circuit in the system clock domain comprises a first-in first-out (FIFO) storage circuit that receives the DRO clock count.

4. A semiconductor device, comprising:
a system clock configured to generate a system clock signal having a system clock period; and
a digital ring oscillator (DRO) cluster having DRO cells, each of the DRO cells having a same ring oscillator disposed at a different location in the semiconductor device for producing a local ring oscillator clock signal for identifying variations in ring oscillator clock speed for determining local voltage variations in a same time window at various locations in the semiconductor device;
wherein the DRO cluster is configured to measure respective ring oscillator clock count in each of the DRO cells during a time window synchronized to the system clock signal, wherein each of the DRO cells comprises a system clock domain configured to provide a time window signal and a DRO clock domain configured to provide the ring oscillator clock count in response to the time window signal, and
wherein each DRO cell is configured to provide a trigger signal based on the respective ring oscillator count being below a minimum threshold value.

5. The semiconductor device of claim 4, wherein each of the DRO cells comprises:
a ring oscillator;
a counter circuit configured for determining the ring oscillator clock counts in the DRO cells within time windows synchronized to the system clock; and
a storage circuit for receiving and storing the ring oscillator clock counts.

6. The semiconductor device of claim 4, wherein the ring oscillator in each of the DRO cells is coupled to a local voltage node derived from the system clock signal.

7. The semiconductor device of claim 5, wherein the storage circuit comprises a first-in first-out (FIFO) storage circuit that continuously receives the ring oscillator clock count.

8. The semiconductor device of claim 4, wherein the DRO cluster further comprises a control circuit coupled to each of the DRO cells for providing an enable signal to each of the DRO cells for synchronizing DRO clock counting in each of the DRO cells to the system clock signal of the semiconductor device, the control circuit further configured for receiving the trigger signal from each of the DRO cells.

9. The semiconductor device of claim 8, wherein the control circuit is coupled to each of the DRO cells using a same number of flip-flops (FFs) for synchronizing the enable signal and trigger signal to each of the DRO cells.

10. The semiconductor device of claim 8, wherein the control circuit is configured to turn off the enable signal to all of the DRO cells upon receiving a trigger signal from any of the DRO cells.

11. The semiconductor device of claim 8, wherein the control circuit is configured to send a system interrupt signal to a debug and trace circuit indicating that a speed degradation trigger event has occurred upon receiving a trigger signal from any of the DRO cells.

12. The semiconductor device of claim 4, wherein the DRO cluster is configured to provide information for identifying a physical location and a system clock timing in the semiconductor device of any event that causes the trigger signal.

13. The semiconductor device of claim 4, wherein the semiconductor device is central processor unit (CPU) or a system on a chip (SoC).

14. A method comprising:
simultaneously determining respective ring oscillator speeds for a plurality of ring oscillator (DRO) cells, each of the plurality of DRO cells disposed associated to a corresponding one of a plurality of circuit components, each circuit component disposed at respective different locations in a semiconductor device, wherein each of the DRO cells has a same ring oscillator for identifying variations in ring oscillator clock speed for determining local voltage variations in a same time window at various locations in the semiconductor device, wherein a control circuit is coupled to each of the DRO cells for providing an enable signal to each of the DRO cells for synchronizing DRO clock counting in each of the DRO cells to a system clock of the semiconductor device; and each of the DRO cells producing a trigger signal if the ring oscillator speed in the DRO cell falls below a reference value;

wherein each of the DRO cells comprises a system clock domain configured to provide a time window signal and a DRO clock domain configured to provide a ring oscillator clock count in response to the time window signal.

15. The method of claim 14, wherein each of the DRO cells performs a method comprising:
producing a ring oscillator clock signal;
determining ring oscillator clock counts within time windows synchronized to the system clock; and
storing the ring oscillator clock counts.

16. The method of claim 15, further comprising storing the ring oscillator clock counts using a first-in first-out (FIFO) storage circuit.

17. The method of claim 14, further comprising setting a window size and a minimum threshold value for each of the DRO cells.

18. The method of claim 17, further comprising turning off an enable signal to all of the DRO cells if a trigger signal is received from any of the DRO cells.

19. The method of claim 17, further comprising producing a system interrupt signal in the semiconductor device if a trigger signal is received from any of the DRO cells.

* * * * *